(12) United States Patent
Chen

(10) Patent No.: US 6,627,913 B2
(45) Date of Patent: Sep. 30, 2003

(54) INSULATION OF AN MRAM DEVICE THROUGH A SELF-ALIGNED SPACER

(75) Inventor: Gary Chen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/950,363

(22) Filed: Sep. 10, 2001

(65) Prior Publication Data

US 2003/0047728 A1 Mar. 13, 2003

(51) Int. Cl.[7] ............................................... H01L 29/06
(52) U.S. Cl. ........................... 257/10; 257/10; 257/412
(58) Field of Search ........................ 257/412; 438/3, 438/682; 365/173

(56) References Cited

U.S. PATENT DOCUMENTS

| | | |
|---|---|---|
| 5,496,759 A | 3/1996 | Yue et al. |
| 5,569,617 A | 10/1996 | Yeh et al. |
| 5,587,943 A | 12/1996 | Torok et al. |
| 5,756,366 A | 5/1998 | Berg et al. |
| 5,982,658 A | 11/1999 | Berg et al. |
| 6,028,786 A * | 2/2000 | Nishimura .................. 365/173 |
| 6,136,705 A * | 10/2000 | Blair ........................... 438/682 |
| 6,153,443 A * | 11/2000 | Durlam et al. .................. 438/3 |
| 6,338,899 B1 * | 1/2002 | Fukuzawa et al. ........... 428/332 |
| 6,379,978 B2 * | 4/2002 | Goebel et al. .................. 438/3 |
| 6,391,658 B1 * | 5/2002 | Gates et al. .................... 438/3 |

* cited by examiner

*Primary Examiner*—David Nelms
*Assistant Examiner*—Thinh Nguyen
(74) *Attorney, Agent, or Firm*—Knobbe, Martens, Olson & Bear, LLP

(57) ABSTRACT

A memory for an integrated circuit and method of fabricating same are provided, comprising providing an array of magnetic memory devices, preferably TMR junctions, that are configured as individual studs and protrude from a substrate. A layer of insulating spacer material is deposited over the array of magnetic memory devices, and a spacer etch is performed to remove the spacer material preferentially from the top surfaces of the magnetic memory devices and from substrate surface areas between the magnetic memory devices. Preferably, the insulating spacer material is low k and/or a barrier to outdiffusion of species from the TMR junctions. Examples include silicon carbide (BLOk™), low temperature silicon nitride or diamond-like carbon. In another embodiment, the insulating spacer material is also a magnetic material and may comprise magnesium-zinc ferrites or nickel-zinc ferrites.

45 Claims, 7 Drawing Sheets

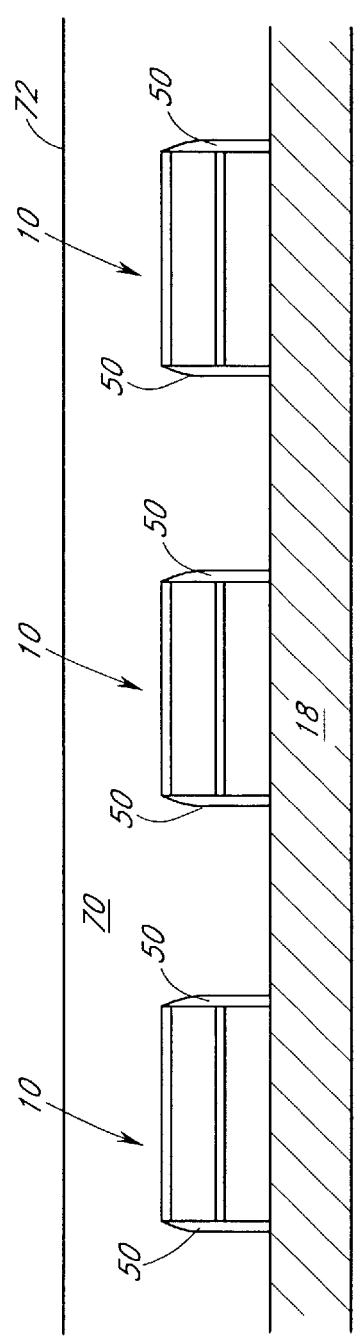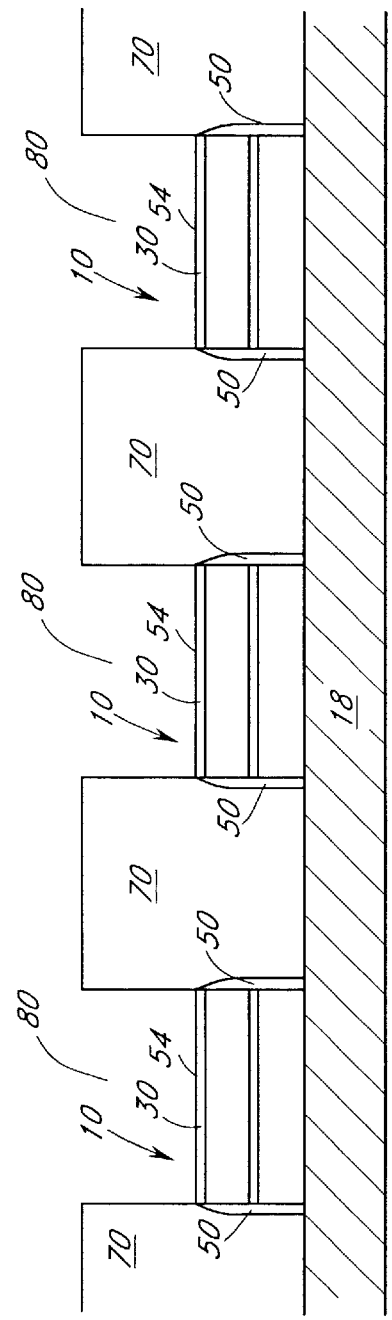

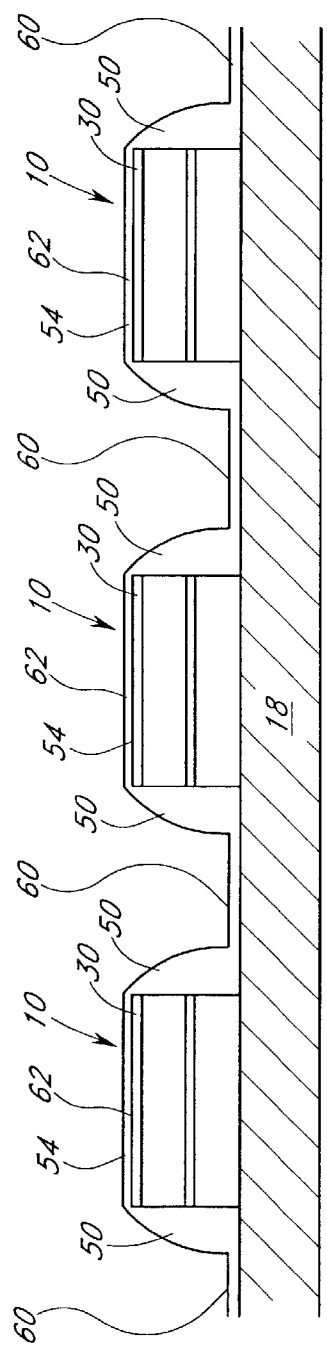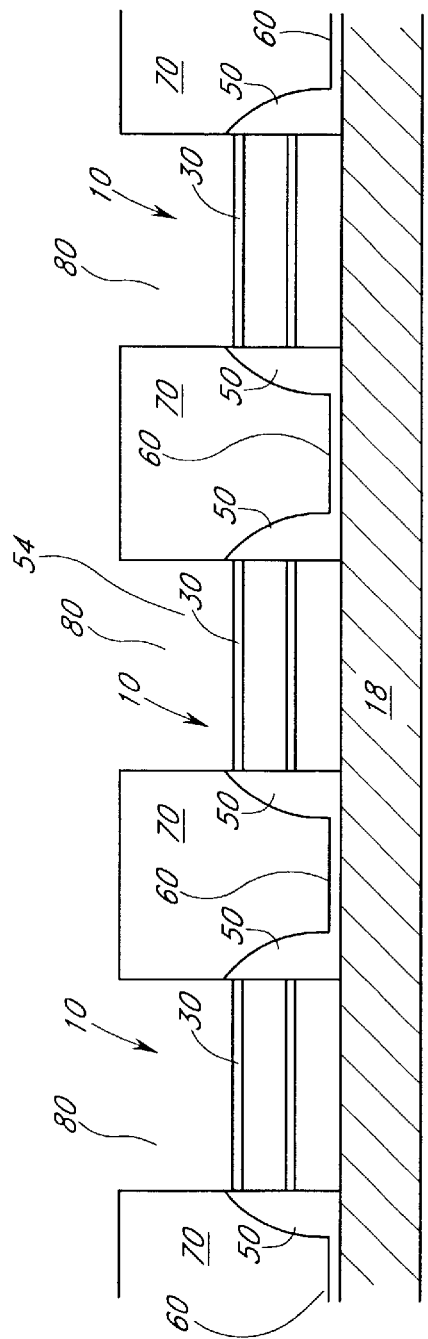

INSULATION OF AN MRAM DEVICE THROUGH A SELF-ALIGNED SPACER

BACKGROUND OF THE INVENTION

1. Field of the Invention

This invention is directed generally to integrated circuit magnetic memory devices for storing information and, more particularly, to methods and structures for insulating the devices.

2. Description of the Related Art

The memory integrated circuit most commonly used in computers and computer system components is the dynamic random access memory (DRAM), wherein voltage stored in capacitors represents digital bits of information. Electric power must be supplied to these memories to maintain the information because, without frequent refresh cycles, the stored charge in the capacitors dissipates, and the information is lost. Memories that require constant power are known as volatile memories.

Non-volatile memories do not need frequent refresh cycles to preserve their stored information, so they consume less power than volatile memories. There are many applications where non-volatile memories are preferred or required, such as in cell phones or in control systems of automobiles.

Magnetic random access memories (MRAMs) are non-volatile memories. Digital bits of information are stored as alternative directions of magnetization in a magnetic storage element or cell. The storage elements may be simple, thin ferromagnetic films or more complex layered magnetic thin-film structures, such as tunneling magnetoresistance (TMR) or giant magnetoresistance (GMR) elements.

Memory array structures are formed generally of a first set of parallel conductive lines covered by an insulating layer, over which lies a second set of parallel conductive lines, perpendicular to the first lines. Either of these sets of conductive lines can be the bit lines and the other the word lines. In the simplest configuration, the magnetic storage cells are sandwiched between the bit lines and the word lines at their intersections. More complicated structures with transistor or diode configurations can also be used. When current flows through a bit line or a word line, it generates a magnetic field around the line. The arrays are designed so that each conductive line supplies only part of the field needed to reverse the magnetization of the storage cells. Switching occurs only at those intersections where both word and bit lines are carrying current. Neither line by itself can switch a bit; only those cells addressed by both bit and word lines can be switched. In some arrangements, one or both of a sense line and a bit line cooperates with a word line to flip the bit.

FIG. 1 illustrates, by way of example, the three functional layers of a simple TMR device. TMR devices 10 work by electron tunneling from one magnetic layer to another through a thin barrier layer 12. The tunneling probability is greatest when the magnetic layers 14, 16, on either side of the barrier layer 12, have parallel magnetizations and least when the magnetizations are anti-parallel. In order for the devices to function properly, these layers must be electrically isolated from one another. Any short-circuiting of the tunnel dielectric layer prevents proper reading of the layers' relative magneto-resistance, which represents the data storage of the device.

Materials used in layers of the TMR devices, especially metals such as nickel, iron and cobalt can diffuse out from the devices and into other functional areas of the integrated circuit, especially during subsequent processing steps at elevated temperatures.

In the prior art, the dielectric layer 20 shown in FIG. 1 served both as electrical insulation around the magnetic memory devices and as a barrier to outdiffusion of TMR device species. Silicon nitride is the material most often used for this dual purpose. Silicon nitride is a very hard material and tends to make conformal layers. When deposited over the magnetic memory array 10, the top surface of the silicon nitride 20 is not flat, and a chemical mechanical planarization step is performed before additional processing to form conducting lines that contact the top surfaces of the devices.

The high current density carried by the bit and word lines makes copper conductors desirable for MRAM arrays to reduce the likelihood of electromigration. Copper conducting lines are made usually using a damascene process. A copper conducting line 18, in contact with the bottom of the TMR devices 10 is shown in the plane of the paper in FIG. 1. To make conducting lines at the top of the devices, first the silicon nitride layer 20 is deposited over the MRAM array. Trenches (FIG. 2) are etched into the silicon nitride layer to make contact with the top surfaces 22 of the TMR devices 10.

If the mask that defines the trenches is even slightly misaligned, the etching step can cause an overetch along the side of the MRAM device. As shown in FIG. 2, when the copper 24 is deposited, it can fill the overetched area as well, making copper regions 26 along the sides of the TMR devices 10 and short-circuiting the devices 10.

Accordingly, structures for and methods of making MRAM arrays with damascene copper conducting lines with greater design tolerance and which will result in increased yield and reliability for MRAM arrays using TMR devices are needed.

SUMMARY OF THE INVENTION

In accordance in one aspect of the present invention, a memory for an integrated circuit and method of fabricating same are provided. An array of magnetic memory devices, preferably TMR junctions, are configured as individual studs and protrude from a substrate. A layer of insulating spacer material is deposited over the array of magnetic memory devices and a spacer etch is performed to remove the spacer material preferentially from top surfaces of the magnetic memory devices and from substrate surface areas between the magnetic memory devices. Next, a filler dielectric layer is deposited to fill at least regions over the substrate and between the magnetic memory devices.

Preferably, the insulating spacer material is also a barrier to outdiffusion of species from the TMR junctions and may consist of silicon carbide (e.g., BLOk™), low temperature silicon nitride or diamond-like carbon. In another embodiment, the insulating spacer material is also a magnetic material and may comprise magnesium-zinc ferrites or nickel-zinc ferrites.

The material for the filler dielectric layer may comprise spin-on-glass, borophosphosilicate glass, fluorinated silicate glass or hydrogen silsesquioxane glass. Preferably, the filler dielectric layer can be etched selectively relative to the spacer material. Trenches are etched into the filler dielectric layer to make contact to the TMR devices as for a damascene process.

In accordance with another aspect of the invention, an array of magnetic memory cells are provided on a substrate wherein each magnetic memory cell comprises a tunneling magnetoresistance (TMR) structure in a stud configuration, a spacer surrounding the TMR structure and at least two electrodes that make contact to the TMR structure. Regions between and over individual cells are filled with a dielectric material that reflows easily.

In one arrangement, the spacer comprises a low k insulator and is a barrier to diffusion of TMR structure species. In another arrangement, the spacer comprises a material with high magnetic permeability. In some arrangements, regions between individual cells have spacer material between the dielectric layer and the substrate, in addition to filler dielectric thereover.

BRIEF DESCRIPTION OF THE DRAWINGS

FIG. 6 is a schematic cross section of the TMR cells of FIG. 5 after deposition of a filler dielectric layer to fill the areas between the cells.

FIG. 7 is a schematic cross section of the TMR cells of FIG. 6 after etching trenches that expose the top surfaces of the TMR cells.

FIG. 8 is a schematic cross section of the TMR cells of FIG. 4 showing spacers along the sides of the TMR cells and residual spacer material on horizontal surfaces after a partial spacer etch has been performed in accordance with an alternative embodiment.

FIG. 9 is a schematic cross section of the TMR cells of FIG. 8 after deposition of a dielectric layer to fill the areas between the cells and after trenches have been etched and residual spacer material has been removed, thus exposing the top surfaces of the TMR cells.

DETAILED DESCRIPTION OF THE PREFERRED EMBODIMENT

It is well-known that cells employing the tunneling magnetoresistance (TMR) effect can be used for making magnetic random access memory arrays (MRAMs). The embodiments of this invention can be used to advantage on TMR MRAMs having any of a number of TMR stack configurations and fabricated by any of a number of methods. The figures show the simplest configuration for illustrating the preferred embodiment. Generally, a TMR stack comprises a stack of layers that includes a layer of pinned hard magnetic material, a stack of layers that includes a sense layer of soft magnetic material and a tunneling dielectric layer separating the two stacks. An exemplary stack below the dielectric includes a tantalum seed layer, a nickel-iron seed layer, a magnesium oxide pinning layer and a nickel-iron or nickel-iron-cobalt pinned layer. An exemplary tunneling dielectric layer over this stack comprises aluminum oxide. An exemplary stack over the tunnel dielectric includes a nickel-iron or nickel-iron-cobalt sense layer, a tantalum barrier layer and a tungsten nitride layer.

Figure 1:
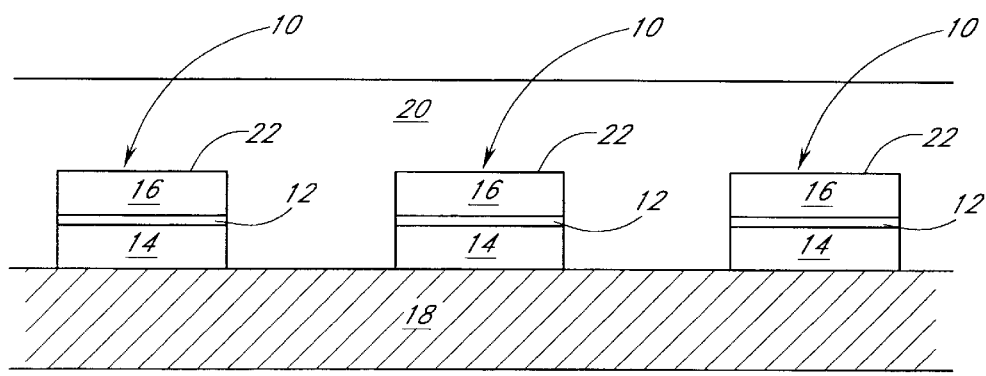
FIG. 1 is a schematic cross section of TMR cells in a portion of an MRAM array and having a stud configuration on a substrate, over which a dielectric layer has been deposited according to the prior art.
Figure 3:
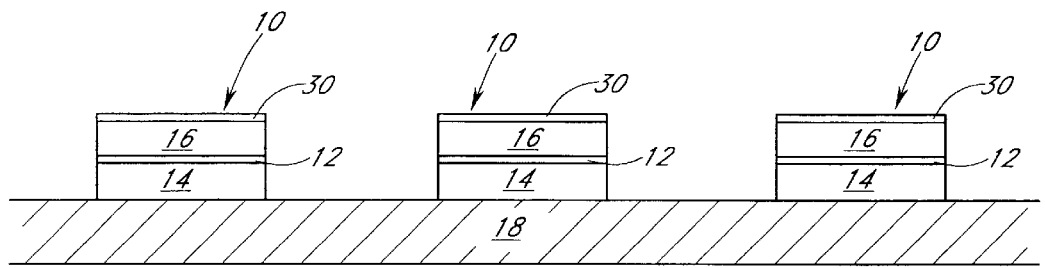
FIG. 3 is a schematic cross section of TMR cells in a stud configuration on a substrate, which form a portion of an MRAM array, constructed in accordance with the preferred embodiments.

As shown in FIG. 3, the description of the first embodiment will use, as a starting point, an array of TMR cells 10 having stud configurations and protruding from a substrate that may contain other devices consistent with integrated circuit manufacture. The cells 10 have a similar construction to that described above with respect to FIG. 1. It is preferred that the top layer 30 of the TMR cells comprises a conductive barrier layer comprising tantalum in the illustrated embodiment. Just below the TMR cells and making electrical contact with them are a series of parallel conductive lines, preferably comprising copper, one of which 18 is shown contacting the devices and in the plane of the page in FIG. 3.

Figure 4:
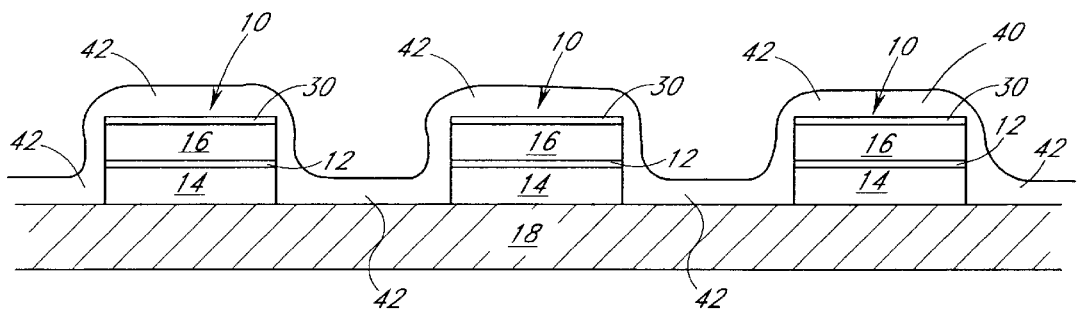
FIG. 4 is a schematic cross section of the TMR cells of FIG. 3 after a layer of spacer material has been deposited, in accordance with a preferred embodiment of the present invention.

In the illustrated embodiment of the current invention, a blanket layer of spacer material 40 is deposited over the MRAM array, as shown in FIG. 4. In one arrangement, the spacer material comprises $Si_3N_4$. Preferably, the spacer material is a low k electrical insulator to prevent shorting out the memory devices. Preferably the value of k is less than 3.5, more preferably less than 3.0. The thickness of the deposited spacer layer is preferably between about 5 nm and 100 nm, more preferably between about 20 nm and 40 nm. Preferably, the spacer material comprises a material that acts as a barrier to outdiffusion of metals from the TMR stack. Materials that have these characteristics include low temperature silicon nitride (apart from the low k characteristic), diamond-like carbon and silicon carbide, preferably as produced by the BLOk™ (Barrier LOw k) chemical vapor deposition process of Applied Materials in Santa Clara, Calif.

Alternatively, the spacer layer 40 comprises a material that, in addition to having a low k and being a diffusion barrier, has high magnetic permeability and low coercivity. In one arrangement, the magnetic permeability is between about 10 and 1 gauss/oersted, and the coercivity is less than about 0.1 oersted. In another arrangement, the magnetic permeability is between about 1 and 2 gauss/oersted, and the coercivity is less than about 1.0 oersted. Such a material additionally provides protection from stray magnetic fields for data stored in the device. Preferred materials for magnetic protection include dielectric magnetic materials, such as magnesium-zinc ferrites ((MnZn) O. $FezO_3$) and nickel-zinc ferrites ((NiZn) O. $Fe_2O_3$). The spacer layer is deposited by any suitable process, including physical vapor deposition or chemical vapor deposition.

The spacer layer is etched, preferably using an anisotropic etch process that preferentially etches the horizontal portions 42 of the spacer layer 40. More preferably, the spacer etch is selective against etching tantalum, thus allowing the tantalum layer 30 to act as an etch stop and protecting the TMR memory structures. A physical process, such as ion milling, can be used for all spacer materials. Preferably, the spacer etch has a chemical component and is a reactive ion etch (RIE). Preferred etchants for silicon carbide include $CF_4$, $CH_2F_2$ and $C_2F_6$. Preferred etchants for silicon nitride include $CF_4$ and $CHF_3$. Preferred etchants for diamond-like carbon include oxygen-based plasma. Preferred etchants for magnesium-zinc ferrites and nickel-zinc ferrites include $Cl_2$- and $CF_4$-based RIE.

Figure 5:
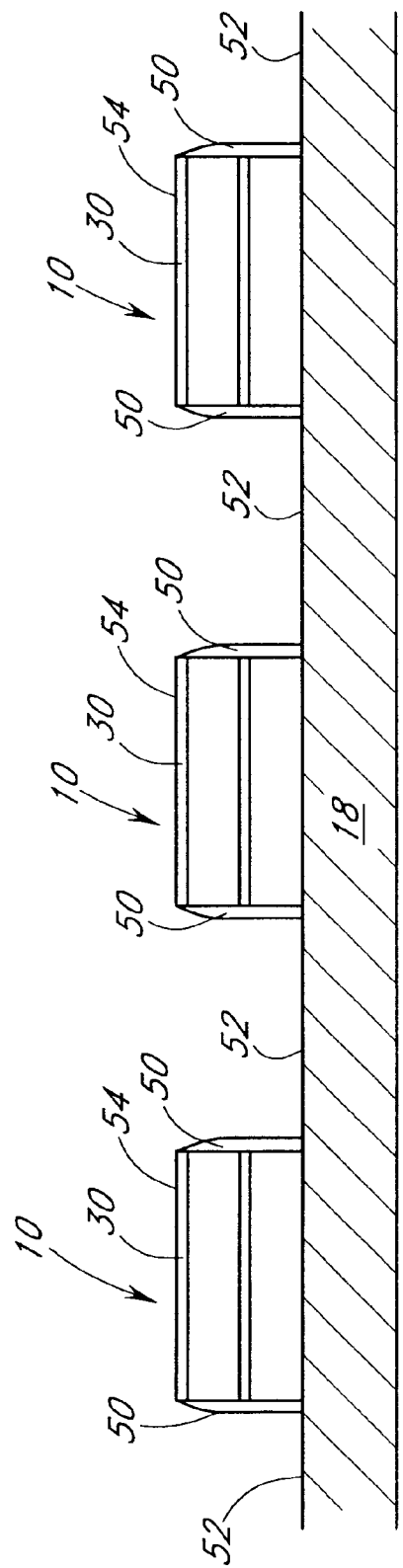
FIG. 5 is a schematic cross section of the TMR cells of FIG. 4 showing spacers along the sides of the TMR cells after a preferred spacer etch has been performed.

The spacer etch leaves a plurality of spacers 50 over sidewalls of the MRAM devices 10, as shown in FIG. 5, wherein all spacer material has been removed from horizontal substrate surfaces 52 and from top surfaces 54 of the devices 10.

A filler dielectric layer 70 is deposited over the MRAM array, as shown in FIG. 6 for the illustrated embodiment. The thickness of the filler dielectric layer 70 is preferably between about 50 nm and 150 nm, more preferably, between about 100 and 120 nm. Because the TMR cells 10 are surrounded by the spacers 50, which are barriers to outdiffusion of TMR species, choice of a dielectric fill material is not limited to those with good diffusion barrier properties. Softer dielectric materials than the silicon nitride can be used. One benefit is that softer materials flow well and are better able to form flat, smooth surfaces 72, even over varied topography. These kinds of materials are reflowable, so chemical-mechanical planarization is not necessary, thus saving valuable time in processing and avoiding the contamination and other problems associated with a separate planarization step. Another benefit is that dielectric materials can be chosen with k values less than that of silicon nitride, thus lowering the RC delay of the memory array. Furthermore, replacing a thick silicon nitride layer with the softer oxide-based materials, preferably reflowable materials, also reduces stress in the integrated circuit. Reduced stress, in turn, leads to less defects and higher yield for the fabrication process.

It is also preferred that the filler dielectric material 70 is selectively etchable in relation to the spacer material. Preferred dielectric materials include SOG (spin-on glass), BPSG (borophosphosilicate glass), FSG (fluorinated silicate glass) and HSG (hydrogen silsesquioxane glass). These materials can be deposited by chemical vapor deposition or any other suitable method.

In FIG. 7, a set of parallel damascene trenches 80, shown perpendicular to the page and to the copper line 18 below the TMR devices 10, has been etched to expose the top surfaces 54 of the devices. In the illustrated embodiment, the top surface 54 of the TMR structure 10 comprises tantalum with no residual spacer material thereon. The tantalum layer 30 acts as an etch stop, protecting the TMR structure during the dielectric trench etch. The preferred spacers 50 also alleviate problems of mask misalignment.

Over the TMR cells 10 are trenches 80 that are also perpendicular to the page. In the final structure, conducting metal lines (not shown) fill the trenches 80, making electrical contact to the top surfaces 54 of the TMR cells 10 and have top surfaces level with the top surface of the fill dielectric 70.

An alternative embodiment is shown in FIG. 8, wherein a small amount of spacer material 60, 62 remains both on the substrate 18 and on the top surface 54 of the device 10, respectively. As stated above, the spacer material is preferably an electrical insulator, more preferably low k, so it does not short across the tunnel dielectric nor does layer 60 short devices to one another. The remaining spacer material 62 over the memory devices 10 can be removed either during the etch process that creates trenches 80 in the filler dielectric layer 70 for the metal contact or from a second etch process used specifically to remove the spacer material after the trenches 80 have been formed. FIG. 9 shows the structure after a filler dielectric layer 70 has been deposited, trenches 80 have been etched and residual spacer material 62 has been removed.

Figure 10:
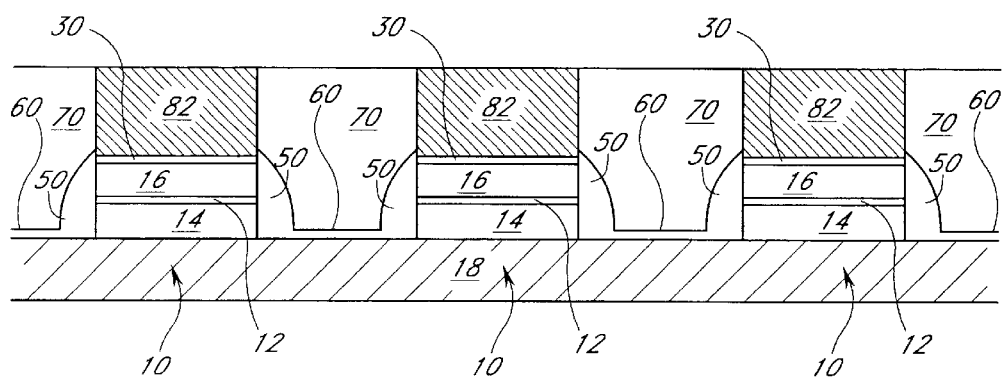
FIG. 10 is a schematic cross section of the TMR cells of FIG. 9 after copper has been deposited to fill the trenches and the top surface has been planarized.

FIG. 10 shows the resulting structure of the alternative embodiment, after damascene processing to make conducting lines 82 in contact with the devices 10. A layer of copper was deposited over the trenches 80 and the filler dielectric layer 70. The copper layer was then planarized, leaving copper conductive lines 82 in the trenches and no copper over the dielectric surface. There is residual spacer material 60 between the substrate 18 and the filler dielectric layer 70.

Figure 2:
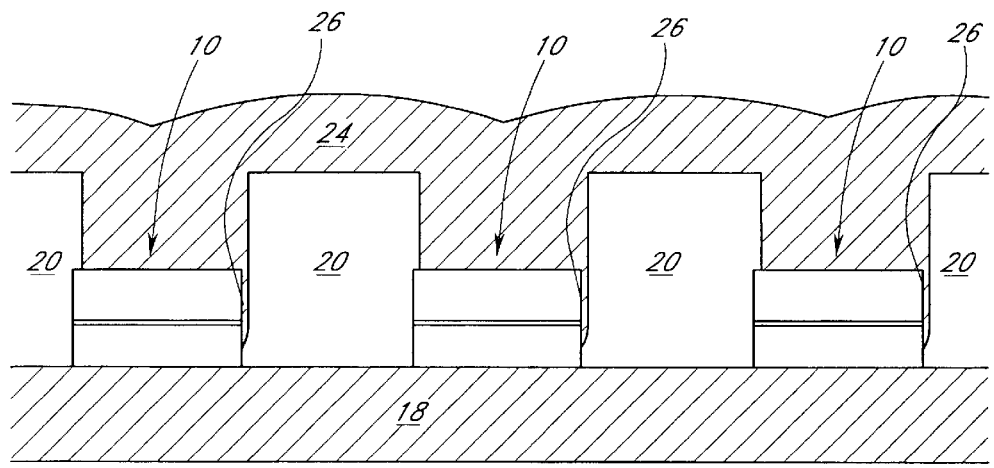
FIG. 2 is a schematic cross section of the MRAM array of FIG. 1 after trench etch and copper deposition, wherein misalignment of the etch mask has caused overetching along one side of the TMR cells.

As stated above, with reference to FIG. 4, the filler dielectric material 70 is preferably selectively etchable in relation to the spacer material. Even if the mask that defines the trenches is slightly misaligned, the trench etch step will not cause an overetch along the side of the TMR device as was shown in the prior art of FIG. 2. For the embodiment of FIG. 10, even if overetch occurs outside the spacers, the barrier 60 prevents shorting. The process used to etch the dielectric material 70 is selective against the spacer 50. No gaps along the sides of the device will develop, and the copper will not short out the device. Thus greater design tolerance has been achieved for making MRAM arrays with damascene copper conducting lines.

Figure 11:
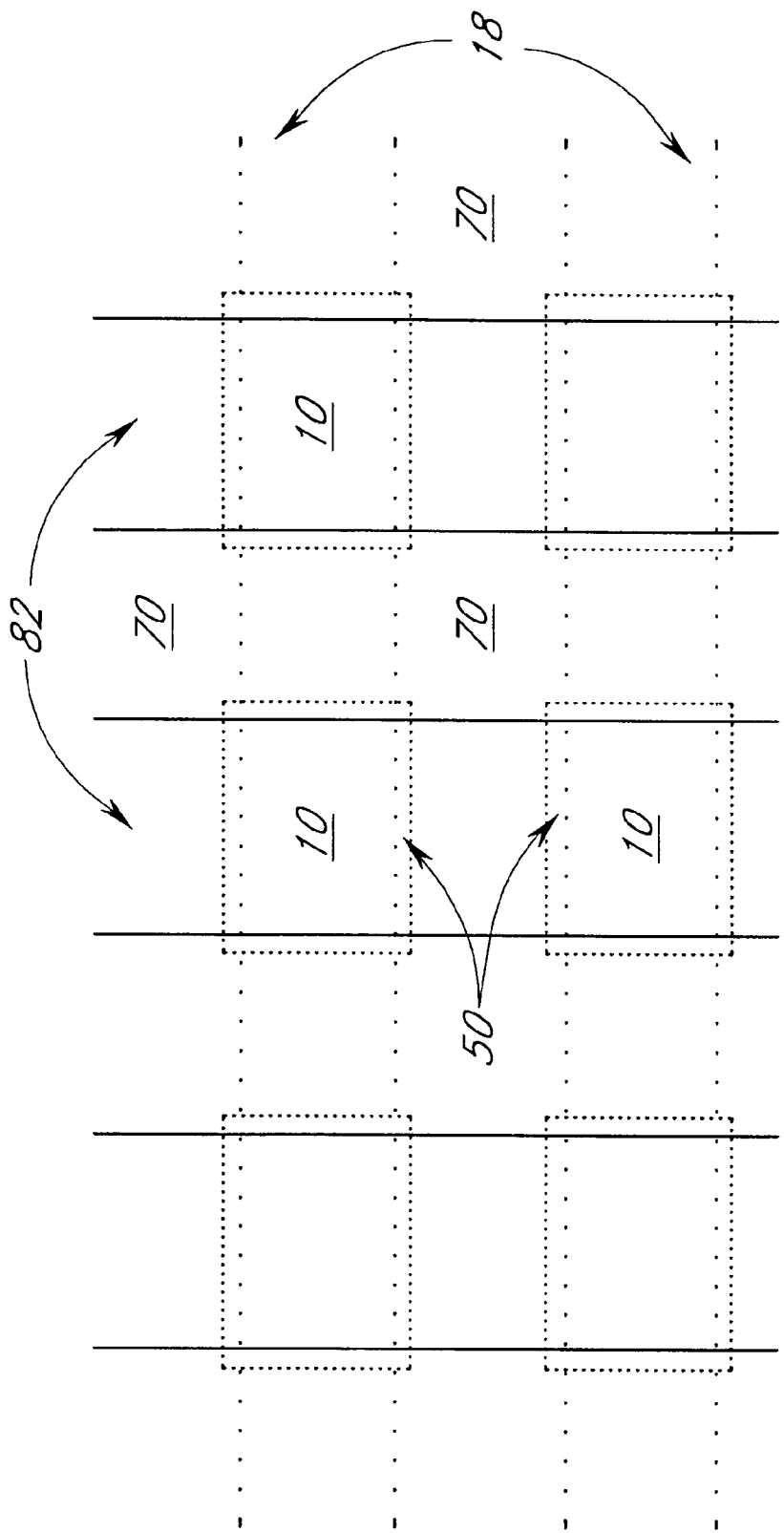
FIG. 11 is a collapsed top view of an array of TMR cells showing metal lines making contact to the cells both above and below the cells.

FIG. 11 shows a top view of a portion of an MRAM array in accordance with preferred embodiment of the current invention. A few layers can be seen in this drawing. The TMR structures 10 are shown as rectangular, and the spacers 50 make continuous contact along all four sides. Alternatively, the TMR structures can have any anisotropic shape.

The top conducting lines 82 are seen as a set of parallel lines making contact to the top surfaces of the TMR cells 10, which are arranged in an array. In a parallel plane, below the plane of the paper and perpendicular to lines 82 are another set of parallel conducting lines 18 in contact with the bottom surfaces of the TMR cells 10. Between the conducting lines 18, 82, are regions of filler dielectric material, configured as columns 70 of material perpendicular to the page. Although it cannot be seen in this view, this filler dielectric material also fills the regions between lines 82 at the top and lines 18 at the bottom of the TMR cells 10.

The preferred embodiments have been described herein in considerable detail to provide those skilled in the art with the information needed to apply the novel principles and to construct and use such specialized components as are required. However, it is to be understood that the invention can be carried out by specifically different equipment and devices, and that various modifications, both as to the equipment and operating procedures, can be accomplished without departing from the scope of the invention itself.

I claim:

1. A method of fabricating a memory for an integrated circuit, comprising:

providing an array of magnetic memory devices that are configured as individual studs and protrude from a substrate;

depositing a layer of insulating spacer material over the array of magnetic memory devices;

performing a spacer etch to remove the spacer material preferentially from top surfaces of the magnetic memory devices and from substrate surface areas between the magnetic memory devices; and depositing a dielectric layer filling at least regions between the magnetic memory devices and having a top surface that is smooth and flat as-deposited.

2. The method of claim 1 wherein the magnetic memory devices are tunneling magnetoresistive (TMR) junctions.

3. The method of claim 2 wherein the insulating spacer material is also a barrier to outdiffusion of species from the TMR junctions.

4. The method of claim 3 wherein the insulating spacer material is a material selected from the group consisting of silicon carbide (BLOk™), low temperature silicon nitride and diamond-like carbon.

5. The method of claim 1 wherein depositing the layer of insulating spacer material comprises depositing the layer of insulating spacer material between about 5 nm and 100 nm in thickness.

6. The method of claim 5 wherein depositing the layer of insulating spacer material comprises depositing the layer of insulating spacer material between about 20 nm and 40 nm in thickness.

7. The method of claim 2 wherein the insulating spacer material is also a magnetic material.

8. The method of claim 7 wherein the spacer material is a material selected from the group consisting of magnesium-zinc ferrites and nickel-zinc ferrites.

9. The method of claim 2 wherein top surfaces of the TMR junctions comprise tantalum.

10. The method of claim 1 wherein the spacer etch comprises physical etching.

11. The method of claim 1 wherein the spacer etch comprises chemical etching.

12. The method of claim 1 wherein the spacer etch comprises reactive ion etching.

13. The method of claim 12 wherein e chant is selected from the group consisting of $CF_4$, $CH_2F_2$, $CHF_3$, $C_2F_6$ and $Cl_2$.

14. The method of claim 1 wherein the etchant is oxygen-based plasma.

15. The method of claim 1 wherein depositing the dielectric layer comprises depositing the dielectric layer between about 50 nm and 150 nm in thickness.

16. The method of claim 1 wherein depositing the dielectric layer comprises depositing the dielectric layer between about 100 nm and 120 nm in thickness.

17. The method of claim 1 wherein the dielectric layer has a dielectric constant lower than that of silicon nitride.

18. The method of claim 1 wherein material for the dielectric layer is selected from the group consisting of spin-on-glass, borophosphosilicate glass, fluorinated silicate glass and hydrogen silsesquioxane glass.

19. The method of claim 1 wherein the dielectric layer can be selectively etched relative to the spacer material.

20. The method of claim 1, further comprising etching through the dielectric layer and any residual spacer material to expose the top surfaces of the magnetic memory devices.

21. The method of claim 20, further comprising depositing a metal layer over the dielectric layer after exposing the top surfaces of the magnetic memory devices.

22. A method of forming a tunneling magnetoresistive (TMR) memory cell, comprising:
   providing a TMR junction stud, with a conductive diffusion barrier layer as a top surface, the stud protruding from a substrate;
   depositing a layer of insulating spacer material over the TMR junction stud; and
   performing a partial spacer etch to remove the spacer material preferentially, but not completely, from the top surface of the TMR stud and from surrounding substrate surface areas, leaving residual spacer material on the top surface of the TMR stud and the substrate surface areas.

23. The method of claim 22, further comprising depositing an oxide-based dielectric layer over the TMR junction stud and surrounding substrate surface, and using a first etch process to etch through the dielectric layer to expose the residual spacer material on the top surface of the TMR junction stud.

24. The method of claim 23, further comprising using a second etch process to remove the residual spacer material from at least a portion of the top surface of the TMR junction stud, thereby exposing the conductive diffusion barrier layer.

25. A method of shielding a magnetic memory cell from stray magnetic fields, comprising:
   depositing a layer of spacer material from a soft magnetic ferrite selected from the group consisting of magnesium-zinc ferrite and nickel-zinc ferrite over the magnetic memory cell; and
   etching to leave only vertical portions of the layer of spacer material surrounding the magnetic memory cell.

26. The method of claim 25 wherein the spacer material has a magnetic permeability between about 1000 gauss/oersted and 2000 gauss/oersted and a coercivity less than about 1.0 oersted.

27. The method of claim 25 wherein the spacer material has a magnetic permeability between about 10 gauss/oersted and 1000 gauss/oersted and a coercivity less than about 0.1 oersted.

28. An array of magnetic memory cells on a substrate wherein each magnetic memory cell comprises:
   a tunneling magnetoresistance (TMR) structure in a stud configuration;
   an insulating spacer surrounding the TMR structure;
   a separate dielectric material around the spacer; and
   at least two electrodes that make contact to the TMR structure.

29. The array of magnetic memory cells of claim 28 wherein a top surface of the TMR structure comprises a conductive diffusion barrier material.

30. The array of magnetic memory cells of claim 29 wherein the conductive diffusion barrier material comprises tantalum.

31. The array of claim 28 wherein the spacer comprises a low k electric insulator.

32. The array of claim 31 wherein the spacer comprises a barrier to diffusion of TMR structure species.

33. The array of claim 32 wherein the spacer comprises a material selected from the group consisting of low temperature silicon nitride, silicon carbide (BLOk™) and diamond-like carbon.

34. The array of claim 28 wherein the spacer comprises a material with a magnetic permeability of at least 10 gauss/oersted.

35. The array of claim 34 wherein the magnetic permeability is between about 10 and 2000 gauss/oersted.

36. The array of claim 34 wherein the spacer comprises a material selected from the group consisting of magnesium-zinc ferrites and nickel-zinc ferrites.

37. The array of claim 32 wherein regions between and over individual cells are filled with a oxide-based dielectric material.

38. The array of claim 37 wherein the dielectric material is selected from the group consisting of spin-on-glass, borophosphosilicate glass, fluorinated silicate glass and hydrogen silsesquioxane glass.

39. The array of claim 37 wherein the top surface of the dielectric material is smooth and level as-deposited.

40. The array of claim 37 wherein regions between individual cells have spacer material between the dielectric layer and the substrate.

41. A magnetic random access memory (MRAM) comprising:
   an array of TMR cells, each TMR cell protruding from a substrate and having contact with a conducting line in the substrate;

an insulating spacer surrounding each TMR cell, the spacer comprising a material that is a barrier to diffusion of TMR species and is electrically insulating;

an oxide-based soft dielectric material filling regions over and between the TMR cells and having a flat top surface;

a residual layer of spacer material between the dielectric material and the substrate, where the residual layer extends between TMR cells; and copper conducting lines having contact with the TMR cells and lying in a set of parallel trenches in the dielectric material.

42. The array of claim 28, wherein the k value of the separate dielectric material is less than the k value of silicon nitride.

43. The array of claim 28, wherein the spacer is fabricated from silicon nitride, and the separate dielectric material has a k value less than silicon nitride.

44. The array of claim 28, wherein the spacer is fabricated from silicon nitride, and the separate dielectric material is softer than silicon nitride.

45. The array of claim 28, wherein the separate dielectric material is selectively etchable in relation to the spacer material.

* * * * *